(12) United States Patent
Aikins et al.

(10) Patent No.: US 7,686,645 B2
(45) Date of Patent: Mar. 30, 2010

(54) APPARATUS AND METHOD OF ZEROING A TEST INSTRUMENT

(75) Inventors: Brian Stanley Aikins, Everett, WA (US); Greg Edward Foisy, Everett, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 12/194,187

(22) Filed: Aug. 19, 2008

(65) Prior Publication Data
US 2010/0045262 A1 Feb. 25, 2010

(51) Int. Cl.
*H01R 31/08* (2006.01)
(52) U.S. Cl. ..................................... 439/510
(58) Field of Classification Search ................ 439/510, 439/507, 513, 512, 189
See application file for complete search history.

(56) References Cited

U.S. PATENT DOCUMENTS

| | | | |
|---|---|---|---|
| 1,982,501 A | 11/1934 | Douglas | |
| 2,700,752 A | 1/1955 | Cataldo | |
| 3,601,756 A | 8/1971 | Stroh | |
| 3,951,497 A | 4/1976 | Balzano et al. | |
| 4,029,377 A | 6/1977 | Guglielmi | |
| 4,449,771 A | 5/1984 | Carr | |
| 4,470,651 A | 9/1984 | Schwab | |
| 4,820,194 A | 4/1989 | Stine | |
| 5,106,324 A * | 4/1992 | Natsume | 439/510 |
| 6,428,349 B1 * | 8/2002 | Dickson et al. | 439/513 |
| 6,634,891 B1 * | 10/2003 | Cheng | 439/68 |

FOREIGN PATENT DOCUMENTS

| | | |
|---|---|---|
| EP | 0 509 634 | 10/1992 |
| GB | 2 363 526 | 12/2001 |
| WO | WO-97/22997 | 6/1997 |
| WO | WO-97/22998 | 6/1997 |

OTHER PUBLICATIONS

Extended European Search Report; European Patent Application No. 08162636.8; Applicant: Fluke Corporation; Mailed Feb. 10, 2009; 8 pages.

* cited by examiner

*Primary Examiner*—Phuong K Dinh
(74) *Attorney, Agent, or Firm*—Perkins Coie LLP

(57) ABSTRACT

An apparatus and method for shorting together a plurality of electrical leads. The apparatus includes an electrical conductor that extends between first and second ends and a first surface and a second surface facing away from the first surface. The electrical conductor includes a central bight that is disposed between the first and second ends and has a concave contour that defines a portion of the first surface. The electrical conductor also includes first and second bights that have convex contours that define portions of the first surface. The first bight is disposed between the central bight and the first end and the second bight is disposed between the central bight and the second end. The electrical conductor also includes a first and second contact segments that are respectively disposed between the first and second bights and the first and second ends.

14 Claims, 5 Drawing Sheets

Figure 4
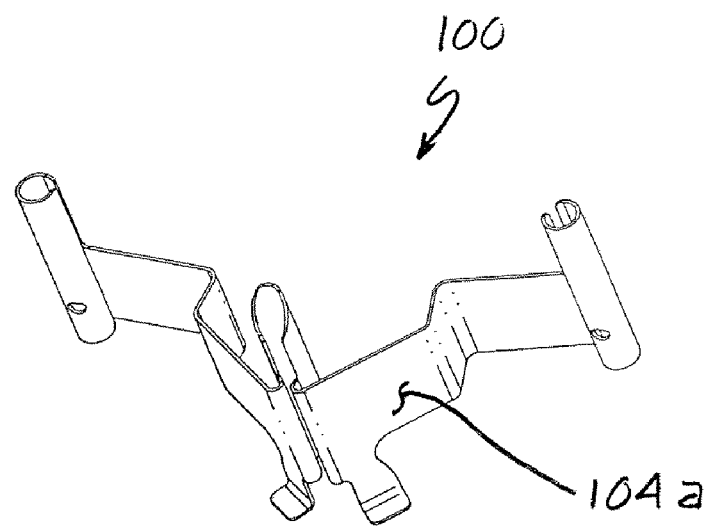
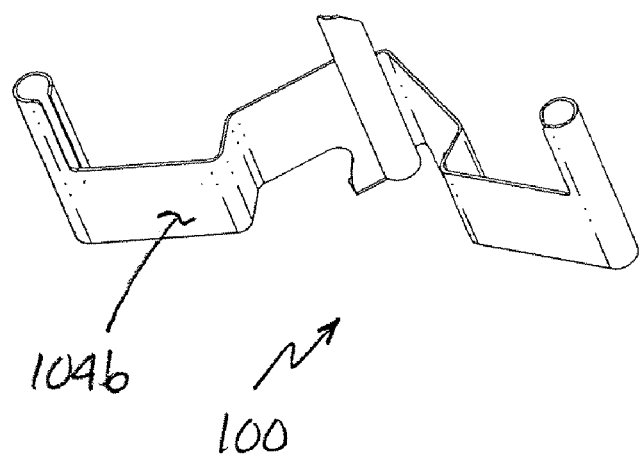
Figure 5

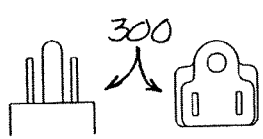 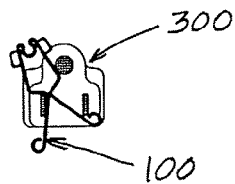
Fig. 7A  Fig. 7B  Fig. 7C
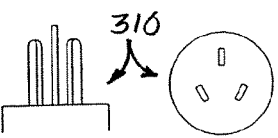  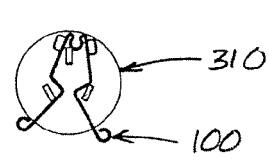
Fig. 8A  Fig. 8B  Fig. 8C
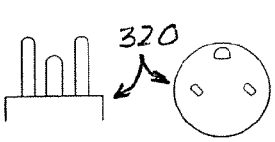  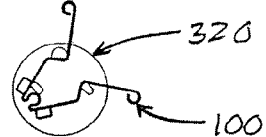
Fig. 9A  Fig. 9B  Fig. 9C
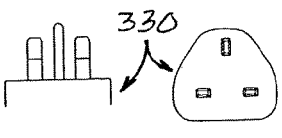  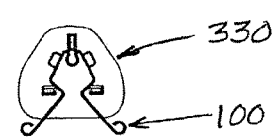
Fig. 10A  Fig. 10B  Fig. 10C
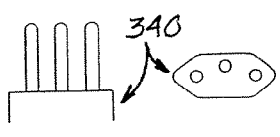 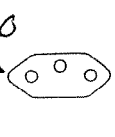 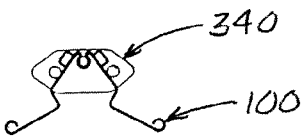
Fig. 11A  Fig. 11B  Fig. 11C
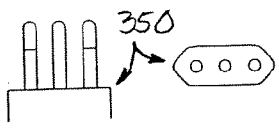 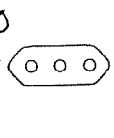 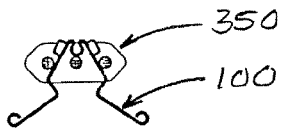
Fig. 12A  Fig. 12B  Fig. 12C
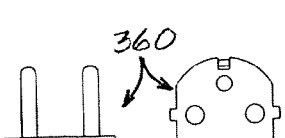  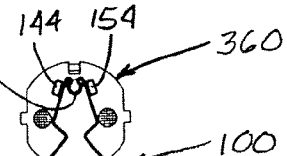
Fig. 13A  Fig. 13B  Fig. 13C Figure 14
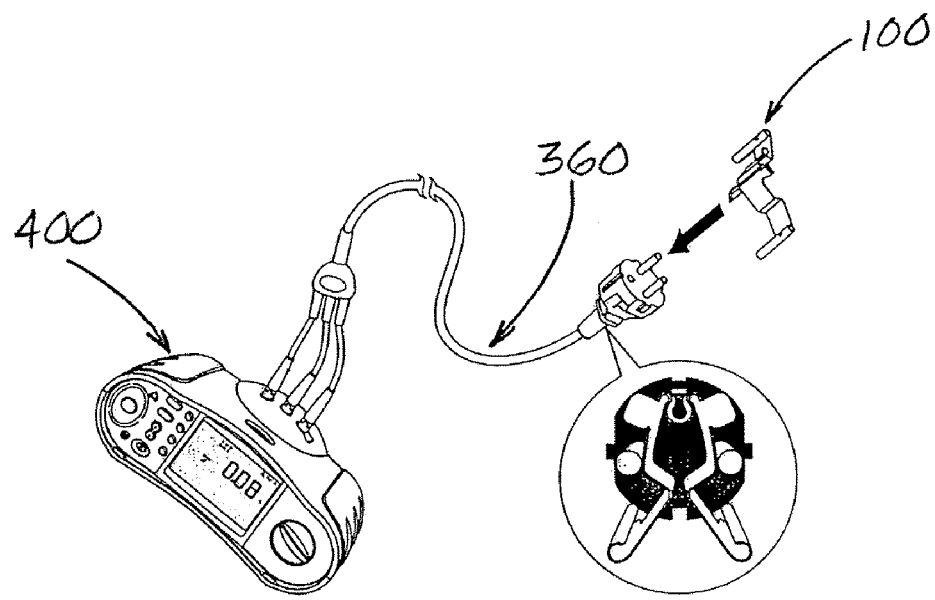
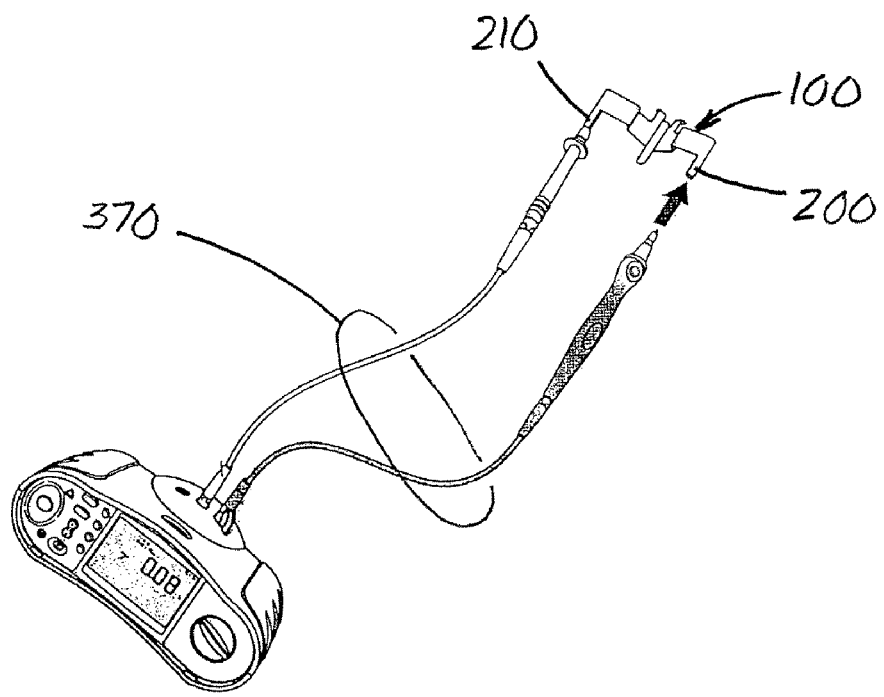
Figure 15

APPARATUS AND METHOD OF ZEROING A TEST INSTRUMENT

TECHNICAL FIELD

The present disclosure relates to test instruments. More particularly, the present disclosure relates to the use of a zeroing apparatus to short together a plurality of leads.

BACKGROUND

A multimeter is an electronic measuring instrument that may combine in one unit a number of functions including the ability to measure voltage, current and resistance. Typically, a multimeter can perform these functions to a very high degree of accuracy. Accordingly, multimeters are typically used to diagnose or evaluate electrical devices such as batteries, motor controls, appliances, power supplies, and wiring systems.

To measure continuity or loop/line impedance accurately, a multimeter is typically calibrated or "zeroed" prior to making a measurement. Insofar as the resistance of the test leads that are used with the multimeter can impact accuracy, zeroing is typically performed by shorting together the distal ends of the leads, i.e., electrically coupling together those ends of the leads that are not plugged into the multimeter.

The distal ends of leads typically have many different arrangements. For example, conventional leads may be arranged with relatively independent distal ends that may include probe tips, alligator clips, sockets, or other lead ends. The distal ends also may be relatively positioned in a fixed pattern, e.g., so as to mimic appliance and device plugs that get connected to a power source via a wall socket. Given that a large number of options are available for the arrangement of the distal ends, the potential for incompletely shorting together the distal ends is also large.

BRIEF DESCRIPTION OF THE DRAWINGS

FIG. 4 is a first perspective view of the apparatus shown in FIG. 1.

FIG. 5 is a second perspective view of the apparatus shown in FIG. 1.

FIGS. 7A-7C illustrate an intermediate configuration of the apparatus shown in FIG. 1 with respect to a first mains cord.

FIGS. 8A-8C illustrate an intermediate configuration of the apparatus shown in FIG. 1 with respect to a second mains cord.

FIGS. 9A-9C illustrate an intermediate configuration of the apparatus shown in FIG. 1 with respect to a third mains cord.

FIGS. 10A-10C illustrate an intermediate configuration of the apparatus of shown in FIG. 1 with respect to a fourth mains cord.

FIGS. 11A-11C illustrate an intermediate configuration of the apparatus shown in FIG. 1 with respect to a fifth mains cord.

FIGS. 12A-12C illustrate an intermediate configuration of the apparatus shown in FIG. 1 with respect to a sixth mains cord.

FIGS. 13A-13C illustrate an intermediate configuration of the apparatus shown in FIG. 1 with respect to a seventh mains cord.

FIG. 14 illustrates a method according to an embodiment of the present disclosure for shorting together the distal ends of the seventh mains cord shown in FIGS. 13A-13C.

FIG. 15 illustrates a method according to an embodiment of the present disclosure for shorting together independent test probes the distal ends of test leads.

DETAILED DESCRIPTION

Figure 1:
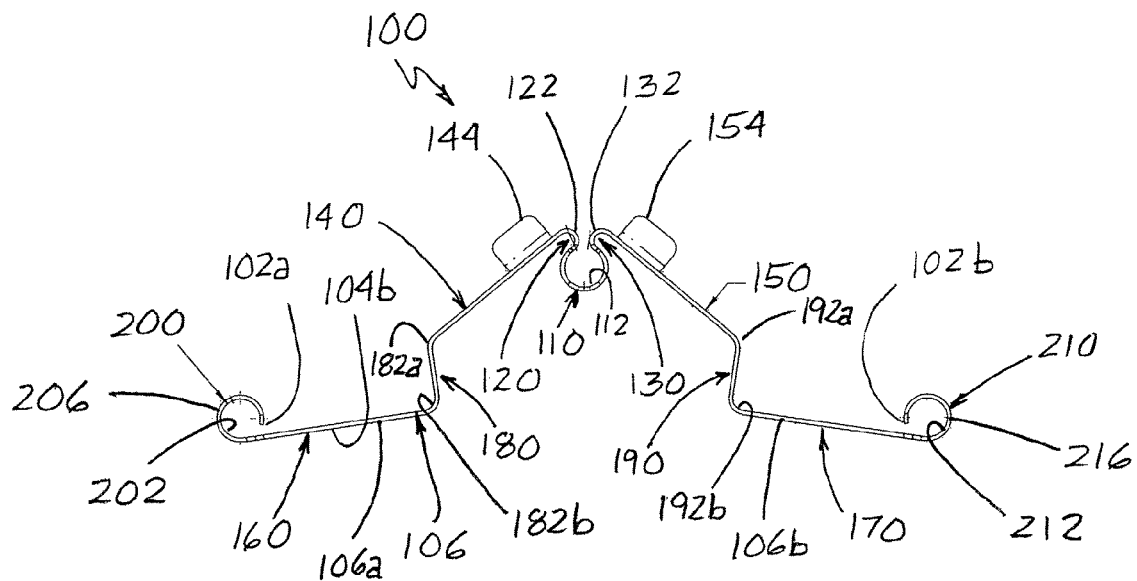
FIG. 1 is a top view of an unloaded configuration of an apparatus for shorting together a plurality of leads according to an embodiment of the present disclosure.
Figure 2:
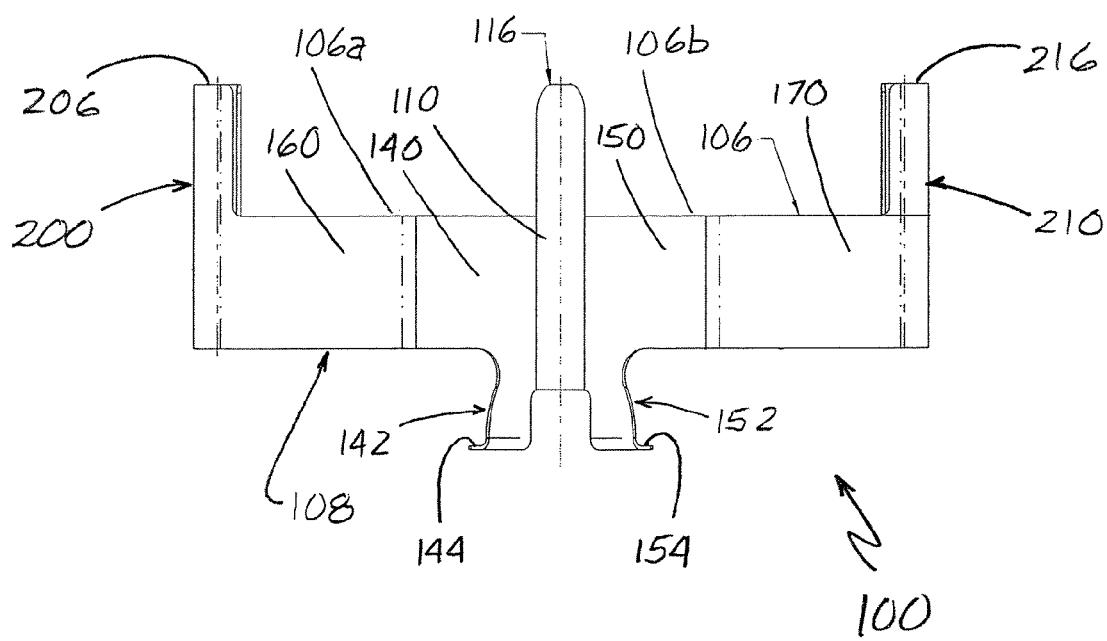
FIG. 2 is a front elevation view of the apparatus shown in FIG. 1.
Figure 3:
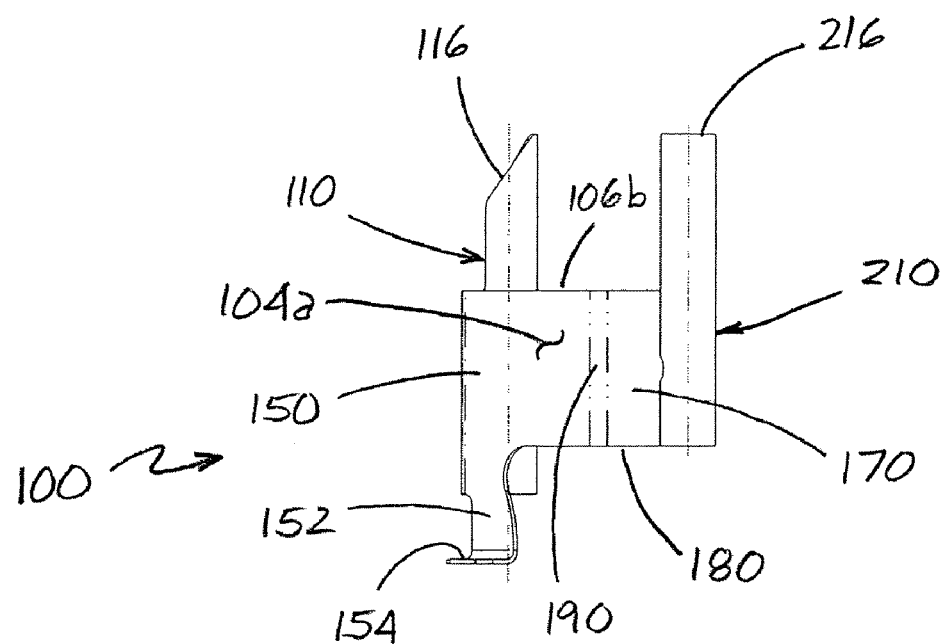
FIG. 3 is a side elevation view of the apparatus shown in FIG. 1.

Specific details of embodiments according to the present disclosure are described below with reference to a zeroing apparatus and methods for shorting together multimeter leads. According to embodiments of the present disclosure, multimeters can be used to measure voltage, current, resistance, temperature, or other parameters.

The term "coupled" can include various types of relationships between two or more components or features. Further, the phrase "electrically coupled" can include a path conductively linking two or more components or features or the phrase "mechanically coupled" may encompass a physical association or structural linking of two or more components or features. Moreover, several other embodiments of the disclosure can have configurations, components, features or procedures different than those described in this section. A person of ordinary skill in the art, therefore, will accordingly understand that the disclosure may have other embodiments with additional elements, or the disclosure may have other embodiments without several of the elements shown and described below with reference to FIGS. 1-15.

FIGS. 1-5 show an apparatus 100 according to an embodiment of the present disclosure. The apparatus 100 can short together a plurality of leads, for example, when zeroing a multimeter (not shown in FIGS. 1-5). The apparatus 100 as shown in FIGS. 1-5 is in an "unloaded configuration," which is the nominal state following its manufacture.

The apparatus 100 can include an electrically conductive strip that extends between first and second ends 102*a* and 102*b*. The apparatus 100 includes a first surface 104*a* and a second surface 104*b* that faces away from the first surface 104*a*. The apparatus 100 further includes a first edge 106 that is spaced from a second edge 108. The first and second edges 106 and 108 couple the first and second surfaces 104*a* and 104*b* and extend between the and second ends 102*a* and 102*b*. According to embodiments of the present disclosure, the electrically conductive strip can include a beryllium copper alloy substrate that is plated with sulphamate nickel. According to other embodiments of the present disclosure, the electrically conductive strip can include a stainless steel alloy or any other material that is electrically conductive, that can be plastically formed, and that can be elastically deformed between loaded and unloaded configurations for 3,000 or more cycles.

The apparatus includes a central bight 110 that is disposed between the first and second ends 102*a* and 102*b*. The central bight 110 has a concave contour 112 that defines a portion of the first surface 104*a*. The central bight 110 also defines an outward projecting central portion 116 of the first edge 106. The central bight 110 can be sized and shaped to resiliently surround an upstanding lead, to facilitate at least in part the elastic deformation of the apparatus 100 between unloaded and loaded configurations, and to resiliently go into an annular lead.

A first bight 120 is disposed between the central bight 110 and the first end 102a. The first bight 120 has a convex contour 122 that defines a portion of the first surface 104a. Similarly, a second bight 130 is disposed between the central bight 110 and the second end 102b. The second bight 130 has a convex contour 132 that also defines a portion of the first surface 104a. A first contact segment 140 is disposed between the first bight 120 and the first end 102a, and a second contact segment 150 is disposed between the second bight 130 and the second end 102b. The first bight 120 and the first contact segment 140 define a first portion 106a of the first edge 106, and the second bight 120 and the second contact segment 150 define a second portion 106b of the first edge 106.

The first contact segment 140 includes a first leg 142 that projects outward from the second edge 108 and the second contact segment 150 includes a second leg 152 that similarly projects outward from the second edge 108. The first leg 142 can include a first foot 144 and the second leg 152 includes a second foot 154. The first and second feet 144 and 154 can perpendicularly project with respect to the first and second contact segments 140 and 150, respectively.

A first grip segment 160 is disposed between the first contact segment 140 and the first end 102a, and a second grip segment 170 is disposed the second contact segment 150 and between the second end 102b. A first intermediate segment 180 is disposed between the first contact segment 140 and the first grip segment 160, and a second intermediate segment 190 disposed between the second contact segment 150 and the second grip segment 170. The first intermediate segment 180 and the first grip segment 160 further define the first portion 106a of the first edge 106 and the second intermediate segment 190, and the second grip segment 170 second portion further define the second portion 106b of the first edge 106. According to embodiments of the present disclosure, the first and second intermediate segments 180 and 190 can include a ridge, hole, or other formation to which alligator clips of independent leads may be attached so as to avoid slippage of the alligator clips' jaws.

A first receptacle 200 is disposed at the first end 102a and includes concave contour 202 that defines a portion of the first surface 104a. A second receptacle 210 is disposed at the second end 102b and includes a concave contour 212 that also defines a portion of the first face 104a. The first receptacle 200 defines a first end portion 206 of the first edge 106 and the second receptacle 210 defines a second end portion 216 of the first edge 106. The first and second end portions 206 and 216 project outward from the first and second portions 106a and 106b, respectively, of the first edge 106. According to embodiments of the present disclosure, the first and second receptacles 200 and 210 can be sized and shaped to resiliently receive and short together test probes of independent leads.

Thus, according to the embodiment of the present disclosure shown in FIGS. 1-5, the central bight 110 is contiguously coupled to the first and second bights 120 and 130. The first bight 110 is contiguously coupled to the first contact segment 140, the first grip segment 160 is contiguously coupled to the first receptacle 200, and the first intermediate segment 180 contiguously couples the first contact segment 140 to the first grip segment 160. Similarly, the second bight 130 is contiguously coupled to the second contact segment 150, the second grip segment 170 is contiguously coupled to the second receptacle 210, and the second intermediate segment 190 contiguously couples the second contact segment 150 to the second grip segment 170. Additionally, the first face 104a is partially defined by the concave contour 112 of the central bight 110, the convex contours 122 and 132 of the first and second bights 120 and 130, and the concave contours 202 and 212 of the first and second receptacles 200 and 210.

With particular reference to FIG. 1, the first intermediate segment 180 is angularly oriented with respect to the first contact segment 140 and with respect to the first grip segment 160. For example, the intermediate segment 180 can be orthogonally disposed with respect to the first grip segment 160 and can be obliquely disposed with respect to the first contact segment 140. Of course, there can be different relative angles of the intermediate segments 180 with respect to the first contact segment 140 and with respect to the first grip segment 160. The second intermediate segment 190 is also angularly oriented with respect to the second contact segment 150 and the second grip segment 170. As shown in the FIG. 1 embodiment, the first intermediate segment 180 is contiguously coupled to the first contact segment 140 by a convex contour 182a that defines a portion of the first surface 104a and is contiguously coupled to the first grip segment 160 by a concave contour 182b that also defines a portion of the first surface 104a. Similarly, the second intermediate segment 190 is contiguously coupled to the second contact segment 150 by a convex contour 192a that defines a portion of the first surface 104a and is contiguously coupled to the second grip segment 170 by a concave contour 192b that defines a portion of the first surface 104a.

Figure 6:
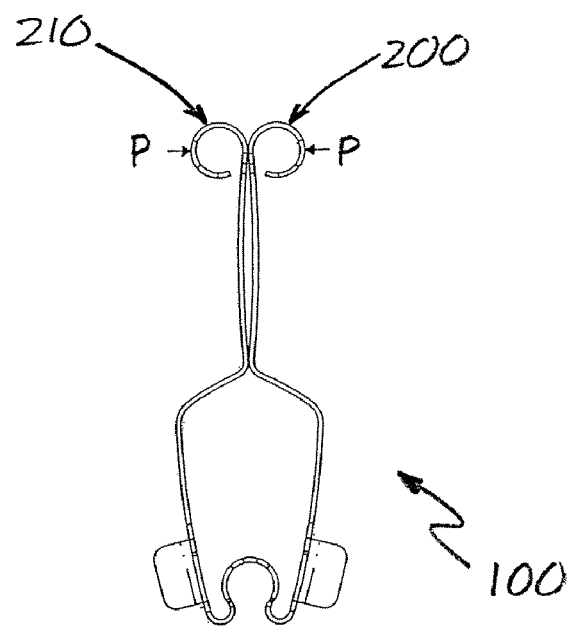
FIG. 6 is a top view illustrating a loaded configuration of the apparatus shown in FIG. 1.

FIG. 6 shows the "loaded" configuration of the apparatus 100. In the present disclosure, the term "load" can refer to storing of potential energy. For example, a compressive force, such as that indicated with arrows P, elastically deforms the apparatus 100 by displacing the first and second receptacles 200 and 210 toward one another, thereby loading the apparatus 100. A partial release of the stored potential energy is referred to in the present disclosure as an "intermediate" configuration.

FIGS. 7A-7C illustrate an intermediate configuration of the apparatus shown in FIG. 1 with respect to a first mains cord 300. As it is used in the present disclosure, a "mains cord" refers to a plurality of leads that are fixed in a pattern. For example, FIGS. 7A and 7B respectively show elevation and end views of three leads arranged in a pattern that mimics a wall socket that is typically used in the United States. FIG. 7C is an end view similar to FIG. 7B that shows an intermediate configuration of the apparatus 100 that is disposed, e.g., intermingled amongst the leads, in the first mains cord 300 pattern such that the three leads are shorted together. In particular, the apparatus 100 is resiliently biased against each of the three leads and provides an electrical conductor that shorts the leads together.

Different mains cords can have different lead patterns. FIGS. 8A and 8B respectively show elevation and end views of a second mains cord 310 including three leads arranged in a pattern that mimics a wall socket that is typically used in Australia. FIG. 8C shows an intermediate configuration of the apparatus 100 disposed in the second mains cord 310 pattern such that the three leads are shorted together. FIGS. 9A and 9B respectively show elevation and end views of a third mains cord 320 including three leads arranged in a pattern that mimics a wall socket that is typically used in Denmark. FIG. 9C shows an intermediate configuration of the apparatus 100 disposed in the third mains cord 320 pattern such that the three leads are shorted together. FIGS. 10A and 10B respectively show elevation and end views of a fourth mains cord 330 including three leads arranged in a pattern that mimics a wall socket that is typically used in the United Kingdom. FIG. 10C shows an intermediate configuration of the apparatus 100 disposed in the fourth mains cord 330 pattern such that the three leads are shorted together. FIGS. 11A and 11B respectively show elevation and end views of a fifth mains cord 340 including three leads arranged in a pattern that mimics a wall socket that is typically used in Switzerland. FIG. 11C shows an intermediate configuration of the apparatus 100 disposed in the fifth mains cord 340 pattern such that the three leads are shorted together. FIGS. 12A and 12B respectively show elevation and end views of a sixth mains cord 350 including three leads arranged in a pattern that mimics a wall socket that is typically used in Italy. FIG. 12C shows an intermediate configuration of the apparatus 100 disposed in the sixth mains cord 350 pattern such that the three leads are shorted together. FIGS. 13A and 13B respectively show elevation and end views of a seventh mains cord 360 including three leads arranged in a pattern that mimics a wall socket that is typically used in Europe. FIG. 13C shows an intermediate configuration of the apparatus 100 disposed in the seventh mains cord 360 pattern such that the three leads are shorted together.

With respect to FIGS. 13B and 13C, the central portion 116 of the central bight 110 extends into and resiliently engages an annular lead, and the first and second feet 144 and 154 can be subsequently grasped to pull the apparatus away from the seventh mains cord 360. According to embodiments in which the apparatus is oriented such that the central portion 116 projects away from a mains cord, the first and second legs 152 and 154 project toward the mains cord. The projection of the first and second legs 152 and 154 from the second edge 108 is selected such that the first and second feet 144 and 154 can displace a safety sheath (not shown) that surrounds one or more of the leads or can maintain the apparatus 100 at a pre-selected distance away from the body of the mains cord such that the apparatus engages electrically conductive portions of the leads.

FIG. 14 illustrates a method according to an embodiment of the present disclosure for shorting together the distal ends of the seventh mains cord 360 shown in FIGS. 13A-13C. An electrical conductor, e.g., apparatus 100, is formed in an unloaded configuration. According to embodiments of the present disclosure, the forming can include plastically forming, e.g., punching, stamping, pressing, casting and/or other manufacturing operations, a substrate of beryllium copper that is plated with sulphamate nickel. The electrical conductor is elastically deformed from the unloaded configuration to a loaded configuration in which potential energy is stored. The electrical conductor is then disposed in a pattern of leads and permitted to resiliently assume an intermediate configuration at a potential energy level between the unloaded and loaded configurations. The electrical conductor in the intermediate configuration contiguously engages all three leads concurrently. As shown in FIG. 14, disposing the electrical conductor can include inserting a projection of the electrical conductor into a recess defined by one of the three leads. The opposite ends of the mains cord 360 can be electrically coupled to a multimeter 400 and a zeroing operation performed by the multimeter 400.

FIG. 15 illustrates another method according to an embodiment of the present disclosure for shorting together the distal ends of test leads. As compared to FIG. 14, a set of test leads 370 include independent test probes that are not relatively fixed in a pattern. The distal ends of the test leads 370 can be resiliently received in the first and second receptacles 200 and 210 and are shorted together by the electrical conductor.

Specific details of the embodiments of the present disclosure are set forth in the description and in the figures to provide a thorough understanding of these embodiments. A person skilled in the art, however, will understand that the invention may be practiced without several of these details or additional details can be added to the invention. Well-known structures and functions have not been shown or described in detail to avoid unnecessarily obscuring the description of the embodiments of the present disclosure.

Unless the context clearly requires otherwise, throughout the description and the claims, the words "comprise", "comprising", and the like are to be construed in an inclusive sense, as opposed to an exclusive or exhaustive sense; that is to say, in the sense of including, but not limited to. Additionally, the words "herein", "above", "below", and words of similar connotation, when used in the present disclosure, shall refer to the present disclosure as a whole and not to any particular portions of the present disclosure. Where the context permits, words in the above Detailed Description using the singular or plural number may also include the plural or singular number respectively. The word "or", in reference to a list of two or more items, covers all of the following interpretations of the word: any of the items in the list, all of the items in the list, and any combination of the items in the list.

The above detailed description of embodiments is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize.

The teachings of the present disclosure provided herein can be applied to systems other than the analysis systems described above. The features of the various embodiments described above can be combined or altered to provide further embodiments.

These and other changes can be made to the invention in light of the above Detailed Description. While the above description describes certain embodiments of the invention, and describes the best mode contemplated, no matter how detailed the above appears in text, the invention can be practiced in many ways. Details of the embodiments in the present disclosure may vary considerably in their implementation details, while still being encompassed by the invention disclosed herein.

The terminology used in the Detailed Description is intended to be interpreted in its broadest reasonable manner, even though it is being used in conjunction with a detailed description of certain specific embodiments according to the present disclosure. Certain terms may even be emphasized; however, any terminology intended to be interpreted in any restricted manner will be overtly and specifically defined as such in this Detailed Description section. In general, the terms used in the following claims should not be construed to limit the invention to the specific embodiments disclosed in the present disclosure, unless the above Detailed Description section explicitly defines such terms. Accordingly, the actual scope of the invention encompasses not only the embodiments disclosed in the present disclosure, but also all equivalent ways of practicing or implementing the invention under the claims.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

The invention claimed is:

1. An apparatus for shorting together a plurality of electrical leads, the apparatus comprising:

an electrical conductor extending between first and second ends, the electrical conductor including a first surface and a second surface facing away from the first surface;

a central bight having a concave contour defining a portion of the first surface, the central bight is disposed between the first and second ends;

a first bight having a convex contour defining a portion of the first surface, the first bight is disposed between the central bight and the first end;

a second bight having a convex contour defining a portion of the first surface, the second bight is disposed between the central bight and the second end;

a first contact segment disposed between the first bight and the first end; and a second contact segment disposed between the second bight and the second end.

2. The apparatus of claim 1, wherein the electrical conductor further comprises:

a first grip segment disposed between the first end and the first contact segment;

a second grip segment disposed between the second end and the second contact segment;

a first intermediate segment disposed between the first contact segment and the first grip segment; and a second intermediate segment disposed between the second contact segment and the second grip segment.

3. The apparatus of claim 2, wherein the electrical conductor further comprises:

a first receptacle disposed at the first end; and a second receptacle disposed at the second end.

4. The apparatus of claim 3, wherein the first receptacle comprises a concave contour defining a portion of the first surface, and the second receptacle comprises a concave contour defining a portion of the first face.

5. The apparatus of claim 4, wherein the central bight is contiguously coupled to the first and second bights, the first bight is contiguously coupled to the first contact segment, the first contact segment is contiguously coupled to the first intermediate segment, the first intermediate segment is contiguously coupled to the first grip segment, and the first grip segment is contiguously coupled to the first receptacle, and wherein the second bight is contiguously coupled to the second contact segment, the second contact segment is contiguously coupled to the second intermediate segment, the second intermediate segment is contiguously coupled to the second grip segment, and the second grip segment is contiguously coupled to the second receptacle.

6. The apparatus of claim 2, wherein the first intermediate segment is angularly oriented with respect to the first contact and first grip segments, and the second intermediate segment is angularly oriented with respect to the second contact and second grip segments.

7. The apparatus of claim 6, wherein the first intermediate segment is contiguously coupled to the first contact segment by a convex contour defining a portion of the first surface and is contiguously coupled to the first grip segment by a concave contour defining a portion of the first surface, and the second intermediate segment is contiguously coupled to the second contact segment by a convex contour defining a portion of the first surface and is contiguously coupled to the second grip segment by a concave contour defining a portion of the first surface.

8. The apparatus of claim 1, wherein the electrical conductor further includes first and second edges, the first edge couples the first and second surfaces, and the second edge couples the first and second surfaces and is latitudinally spaced from the first edge, and the first and second edges extend between the first and second ends.

9. The apparatus of claim 8, wherein the central bight defines a central portion of the first edge, the first bight and the first contact segment define a first portion of the first edge, the second bight and the second contact segment define a second portion of the first edge, and the central portion projects outward from the first and second portions.

10. The apparatus of claim 8, wherein the first contact segment includes a first leg projecting outward from the second edge and the second contact segment includes a second leg projecting outward from the second edge.

11. The apparatus of claim 10, wherein the first leg includes a first foot perpendicularly projecting with respect to the strip, and the second leg includes a second foot perpendicularly projecting with respect to the strip.

12. The apparatus of claim 8, wherein the strip further comprises:

a first receptacle disposed at the first end; and a second receptacle disposed at the second end;

wherein the first portion of the first edge is further defined by the first intermediate and first grip segments, the second portion of the first edge is further defined by the second intermediate and second grip segments, and the first and second receptacles project outward from the first edge.

13. The apparatus of claim 12, wherein the first and second receptacles define end portions of the first edge.

14. The apparatus of claim 1, wherein in the strip comprises a substrate and plating disposed on the substrate, the substrate includes a beryllium copper alloy, and the plating includes sulphamate nickel.

* * * * *